US012624994B2

(12) United States Patent
Hua et al.

(10) Patent No.: US 12,624,994 B2
(45) Date of Patent: May 12, 2026

(54) CREATION OF OPTICALLY STABLE QUANTUM EMITTERS

(71) Applicant: UCHICAGO ARGONNE, LLC, Chicago, IL (US)

(72) Inventors: Muchuan Hua, Naperville, IL (US);
Wei-Ying Chen, Naperville, IL (US);
Hanyu Hou, Downers Grove, IL (US);
Thomas Gage, Bolingbrook, IL (US);
Benjamin Diroll, Chicago, IL (US);
Haihua Liu, Naperville, IL (US);
Jianguo Wen, Bolingbrook, IL (US);
Jian-Min Zuo, Urbana, IL (US)

(73) Assignees: UCHICAGO ARGONNE, LLC, Chicago, IL (US); The Board of Trustees of the University of Illinois, Urbana, IL (US)

( * ) Notice: Subject to any disclaimer, the term of this patent is extended or adjusted under 35 U.S.C. 154(b) by 202 days.

(21) Appl. No.: 18/655,088

(22) Filed: May 3, 2024

(65) Prior Publication Data

US 2025/0341418 A1     Nov. 6, 2025

(51) Int. Cl.
*G01J 1/58* (2006.01)
*C23C 14/04* (2006.01)
(Continued)

(52) U.S. Cl.
CPC .............. *G01J 1/58* (2013.01); *C23C 14/042* (2013.01); *C23C 14/0605* (2013.01);
(Continued)

(58) Field of Classification Search
CPC .... G01J 1/58; G01J 1/0411; G01J 1/44; G01J 3/021; G01J 1/0425; G01J 3/44;
(Continued)

(56) References Cited

U.S. PATENT DOCUMENTS 10,879,445 B2     12/2020  Alemán et al.
11,892,529 B2 *   2/2024   Shi .......................... H10D 62/80
(Continued)

OTHER PUBLICATIONS

Castellanos-Gomez et al., Deterministic transfer of two-dimensional materials by all-dry viscoelastic stamping, 2D Materials 1, 011002:9 pages (2014).
(Continued)

*Primary Examiner* — Uzma Alam
*Assistant Examiner* — Fani Polyzos Boosalis
(74) *Attorney, Agent, or Firm* — MARSHALL, GERSTEIN & BORUN LLP

(57) ABSTRACT

A method and devices for fabricating optical emitters. The method includes disposing a flake of a multi-layer material onto a wafer. The wafer has an aperture over which a portion of the flake is disposed. The flake has a first surface partially in contact with the wafer, and a second surface opposite the first surface. The method further includes disposing a deceleration mask layer adjacent the flake. The deceleration mask layer has a flake-side surface adjacent to the flake, and an exposed surface opposite the flake-side surface. An ion beam is directed at the exposed surface of the deceleration mask layer to decelerate ions of the ion beam until at least a portion of the ions are implanted in the flake.

19 Claims, 13 Drawing Sheets

(51) Int. Cl.

| | |
|---|---|
| *C23C 14/06* | (2006.01) |
| *C23C 14/48* | (2006.01) |
| *G01J 1/04* | (2006.01) |
| *G01J 1/44* | (2006.01) |
| *G01J 3/02* | (2006.01) |
| *G01J 3/44* | (2006.01) |

(52) U.S. Cl.
CPC ............. *C23C 14/48* (2013.01); *G01J 1/0411* (2013.01); *G01J 1/44* (2013.01); *G01J 3/021* (2013.01); *G01J 1/0425* (2013.01); *G01J 2001/442* (2013.01); *G01J 3/44* (2013.01)

(58) Field of Classification Search
CPC ............. G01J 2001/442; C23C 14/042; C23C 14/0605; C23C 14/48
See application file for complete search history.

(56) References Cited

U.S. PATENT DOCUMENTS

| | | | | |
|---|---|---|---|---|
| 11,927,534 | B2 * | 3/2024 | Meng ..................... | G01J 3/0259 |
| 12,068,431 | B2 * | 8/2024 | Nagasawa .......... | H10H 20/8142 |
| 2008/0164427 | A1 * | 7/2008 | Collart ................ | H01J 37/3171<br>250/492.21 |
| 2011/0240889 | A1 * | 10/2011 | Colvin ................ | H01J 37/3171<br>250/492.21 |
| 2019/0288160 | A1 | 9/2019 | Atature et al. | |

OTHER PUBLICATIONS

Duong et al., Effects of High-Energy Electron Irradiation on Quantum Emitters in Hexagonal Boron Nitride, ACS Appl. Mater. Interfaces, 10(29):24886-24891(2018).

He et al., Single quantum emitters in monolayer semiconductors, Nature Nanotechnology, 10(497):6 pages (2015).

Jungwirth et al., Optical absorption and emission mechanisms of single defects in hexagonal boron nitride, Physical Review Letters, 119, 057401:6 pages (2017).

Liu et al., Rational Control on Quantum Emitter Formation in Carbon-Doped Monolayer Hexagonal Boron Nitride, ACS Appl. Mater. Interfaces, 14(2):3189-3198 (2022).

Mendelson et al., Identifying carbon as the source of visible single-photon emission from hexagonal boron nitride, Nature Materials 20, 321:19 pages (2016).

Mendelson et al., Identifying carbon as the source of visible single-photon emission from hexagonal boron nitride, nature materials, 20:321-328 (2021).

Morrow et al., Trapping interlayer excitons in van der waals heterostructures by potential arrays, Phys. Rev. B 104, 195302:11 pages (Jul. 29, 2021).

Novoselov et al., Electric field effect in atomically thin carbon films, Science 306:666-669 (2004).

Parto et al., Irradiation of nanostrained monolayer wse2 for site-controlled single-photon emission up to 150k, in Frontiers in Optics / Laser Science (Optica Publishing Group), p. FW1C.3 (2020).

Ronceray et al., Liquid-activated quantum emission from pristine hexagonal boron nitride for nanofluidic sensing, nature materials, 22:1236-1242 (2023).

Tran et al., Quantum emission from hexagonal boron nitride monolayers, nature nanotechnology, 11(37):6 pages (2015).

Xu et al., Creating Quantum Emitters in Hexagonal Boron Nitride Deterministically on Chip-Compatible Substrates, Nano Letters, 21(19):8182-8189 (2021).

* cited by examiner

CREATION OF OPTICALLY STABLE QUANTUM EMITTERS

STATEMENT REGARDING FEDERALLY SPONSORED RESEARCH OR DEVELOPMENT

This invention was made with government support under Contract No. DE-AC02-06CH11357 awarded by the United States Department of Energy to UChicago Argonne, LLC, operator of Argonne National Laboratory. The government has certain rights in the invention.

FIELD OF THE DISCLOSURE

The present disclosure relates to methods and systems for generating single-photon sources, and specifically, to fabricating single-photon emitters using multi-layer materials.

BACKGROUND

Quantum information technology is a rapidly advancing field with applications across industries such as quantum physics, computer science, information theory, and defense technologies among others. Quantum information technologies, also referred to as quantum information sciences, harness the fundamental principles of quantum mechanics to manipulate, transmit, and process information in ways beyond the capabilities of classical computing and classical communications technologies.

Photon-based quantum information processing is a prominent approach within the broader field of quantum information technology, where individual photons are used as qubits, the fundamental unit of quantum information. Photon-based systems are typically used for investigating, and fabricating, quantum information technologies as they allow for transmission of information over long distances either through free-space or optical fibers. Sources for generating individual photons in a controllable and reliable way are required for many photon-based quantum information systems, and as such, these single-photon sources are in demand across many industries and institutions.

One approach for generating single-photons utilizes single-photon emitters (SPEs). SPEs span a wide variety of types and form factors including quantum dots and molecules, and weak lasers, which operate differently and provide photons with varied properties. For example, some SPEs generate single-photons non-deterministically (i.e., not on demand), and therefore are not efficient or useful for some applications. Additionally, each single-photon source is governed by the Heisenberg uncertainty principle which dictates that the generation of an exact number of photons with a given frequency is forbidden. This restricts each single-photon source to limited frequencies and bandwidths of generated photons. Some SPEs rely on impurities in generating single-photons, which can cause broadened emission bandwidths, non-deterministic emission, reduced coherence, and short performance stability timespans. Further, common SPEs, and specifically SPEs that rely on doping and defects, can cause further structural incongruities in substrates and semiconductor materials during fabrication, which can lead to reduced output emission intensities, reduced device lifetimes, and potential device failure. Additionally, many SPEs require stringent temperature monitoring and control to prevent additional excitations and other physical effects from further degrading device performance.

Due to the drawbacks of current single-photon sources, the use of SPEs is limited to specific environments and implementations. Considering the broad range of uses of SPE technologies, there is need for SPE devices that are more stable, provide greater output intensities, operate at room temperature, and can be deterministic in nature for improving and expanding the use of such devices and furthering the implementation of quantum information technologies.

SUMMARY OF THE DISCLOSURE

In an embodiment, disclosed is a method for fabricating optical emitters. The method includes disposing, onto a wafer, a flake of a multi-layer material, the wafer having an aperture over which a portion of the flake is disposed. The flake has a first surface partially in contact with the wafer, and a second surface, opposite the first surface. The method further includes disposing a deceleration mask layer adjacent to the flake. The deceleration mask layer has a flake-side surface adjacent to the flake and an exposed surface opposite the flake-side surface. An ion beam source directs an ion beam at the exposed surface of the deceleration mask layer to decelerate ions of the ion beam, maximizing the stopping efficiency of the flake, in another word, increasing or maximizing the ion implantation efficiency.

In variations of the current embodiment, wherein the multi-layer material comprises a material having from 4 and 300 layers, or up to as many as layers as desired. The multi-layer material may have a thickness between the first surface and the second surface of 1 nm or greater, 1.3 nm or greater, or as thick as required or desired. In specific examples, the multi-layer material comprises hexagonal boron nitride.

In continued variations of the current embodiment, the ions comprise carbon ions. In more variations of the current embodiment, the deceleration mask layer comprises a carbon film, and/or the deceleration mask has a thickness of 50 nm, 100 nm, or less than 100 nm. In embodiments, disposing the deceleration mask includes disposing the deceleration mask on a copper space grid at a distance away from the second surface of the flake.

In another embodiment, disclosed is a system for generating single-photons. The system includes a single-photon emission device fabricated by (i) disposing, onto a wafer, a flake of a multi-layer material, the wafer having an aperture over which a portion of the flake is disposed, the flake has a first surface partially in contact with the wafer, and a second surface, opposite the first surface, (iii) disposing a deceleration mask layer adjacent to the flake, the deceleration mask layer having a flake-side surface adjacent to the flake and an exposed surface opposite the flake-side surface, and (iii) directing an ion beam at the exposed surface of the deceleration mask layer to decelerate ions of the ion beam until at least a portion of the ions are implanted in the flake. The system for generating single-photons further includes an excitation radiation source configured to provide excitation radiation to the single-photon emission device; lensing optics configured to focus the excitation radiation into the single-photon emission device; and collection optics configured to receive single-photons emitted from the single-photon emission device.

In yet another embodiment, disclosed is a single-photon emission device fabricated according to the method of claim 1, the device including: a multi-layer material flake having (i) a first surface, (ii) a second surface opposite the first surface, (iii) a thickness defined by the orthogonal distance between the first and second surfaces, and (iv) implanted ions within 100 nm of the second surface.

DETAILED DESCRIPTION

Figure 1D:
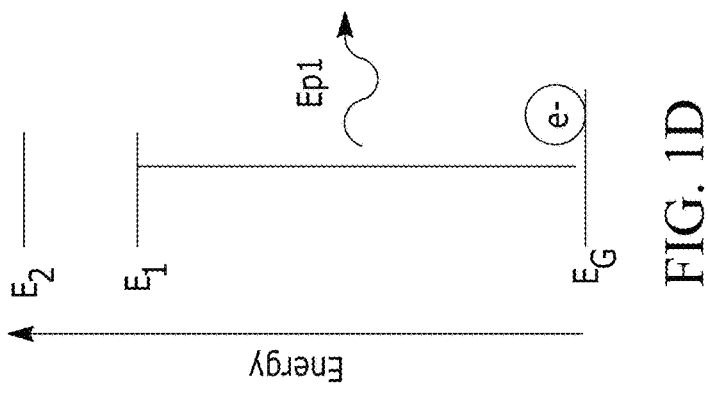
FIG. 1D is a diagram illustrating emission of a photon and relaxation of an electron from a first excited state to a ground state in a three-state SPE.

Single-photon sources are integral in many quantum information systems and technologies. Photon-based systems offer several advantages over utilizing other particles in quantum information technologies. Some advantages of photonic systems include long coherence times, low interaction with the environment, and the ability to transmit quantum information over long distances through optical fibers and free-space. 2D materials such as transition metal dichalcogenide and hexagonal boron nitride (hBN) are capable of hosting single-photon emitters (SPEs), and have attracted much interest for quantum information and quantum technologies. Traditionally 2D materials used for SPE creation are attached or grown on substrates such as silicon or sapphire wafers, which has to be done through a reflective collecting system for 2D materials. Disclosed is a method for fabricating optically stable SPEs on freestanding multi-layer hBN flakes with carbon ion implantation which are operational at room temperatures, have long stability lifetimes, high output intensities, deterministic performance, and narrow wavelength bandwidths as compared to other SPEs.

In electromagnetics, it is common to distinguish between a frequency, wavelength, energy, and color of electromagnetic radiation. Each of these four characteristics is related to the other three. For example, the wavelength, in nanometers (nm), and frequency, in hertz (Hz), for a specified electromagnetic radiation are inversely proportional to each other. Similarly, the energy, in electron-volts (eV) or joules (J), of electromagnetic radiation is proportional to the frequency of that radiation. Therefore, for a given radiation at a given frequency, there is a corresponding wavelength and energy.

The fourth of the aforementioned characteristics, color, typically represents a group or band of frequencies or wavelengths. For example, the color blue is commonly defined as electromagnetic radiation with a wavelength from 450 nm to 495 nm. This wavelength band also corresponds to frequencies from 606 THz to 668 THz, and energies of 2.5 to 2.75 eV. The color blue, then, is any radiation with one of those wavelengths, or radiation with multiple wavelengths in that band. Therefore, the term color may refer to one specific wavelength, or a band of wavelengths. Some areas of trade in electromagnetics prefer the use of one of the four terms to the others (e.g., color and wavelength are preferred when discussing optical filters, whereas frequency and energy are preferred when discussing optical excitation processes). Therefore, the four terms may be understood to be freely interchangeable in the following discussion of electromagnetic radiation and scintillators.

Additionally, as a person of ordinary skill in the art would understand, the terms excited state, excitation state, quantum state, and energy state can be interchangeable when describing the state of a system. Also, the states of a system may also be described as having or existing with a specific energy, E, associated with the state. Therefore, it should be understood that a state may be referred to as an energy state E, or a state with energy E interchangeably. As such, it should be understood that a label E may refer to the energy of a state and/or to the state itself. In photonics, and specifically when considering single-photon emission, the terms emission time, relaxation time, relaxation rate, transmission rate, transition time, decay rate, and decay time are also understood to be related in most cases. In addition, a person of ordinary skill in the art would recognize that the terms excite, promote, or energize are often interchangeable when discussing the transition of a system from one energy level to another, higher, energy level, and similarly the terms de-excite, rest, and recombine may be used interchangeably when discussing the transition of a system from one energy level to another, lower, energy level. The term "excitation state" should be understood to be a non-ground state of a system, the transition to which is stimulated by energy such as by a primary radiation or an excitation radiation provided by an excitation radiation source, or due to relaxation from a higher energy state.

The term "multi-layer material" or "few-layer material" should be understood to be a thin-film material with a unit structure that is periodic in at least one dimension. The unit structure that determines each layer may include an atom, a molecule, a crystal lattice structure, etc. Multi-layer materials are often considered 2D materials that extend in two dimensions with high aspect ratios to a third micro- or nanoscale dimension.

Figure 1C:
FIG. 1C is a diagram illustrating emission of a photon and relaxation of an electron from a second excited state to a first excited state in a three-state SPE.
Figure 1C:
Figure 1B:
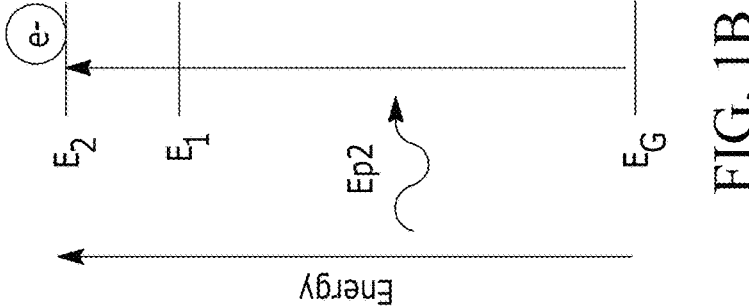
FIG. 1B is a diagram illustrating radiation exciting an electron from the ground state to a second excited state in a three-state SPE.
Figure 1A:
FIG. 1A is a diagram illustrating an electron at ground state in a three-state single-photon emitter (SPE).

FIGS. 1A-1D illustrate the process of single-photon emission via stimulation by radiation, and the subsequent emission of a lower energy photon. FIGS. 1A-1D show an electron, e–, in an SPE, and three energy states: a ground energy state, $E_G$, a primary excited energy state, $E_1$, and a secondary excited energy state, $E_2$. The ground state $E_G$ may be a valence band state (e.g., a heavy-hole, light-hole, or spin-orbit band or state). In FIGS. 1A-1D, the primary excited energy state is the lowest excited state or first excited energy state with energy $E_1$, and the secondary excited energy state is a second excited energy state with an energy $E_2$, greater than $E_1$ with both the primary and secondary bands being in the conduction band. As illustrated in FIG. 1A the electron typically exists in, or occupies, the ground energy state. The electron remains in the ground energy state until some form of excitation or perturbation changes the state of the electron in the scintillator. FIG. 1B illustrates an excitation energy provided by a photon with energy $E_{p2}$. The photon provides energy to the electron exciting it to the second excited state, $E_2$. The energy gap between the ground state and the primary and secondary excited states may be determined by the material properties and dimensions of the scintillator, discussed further below. Once in the secondary excited state, the electron may couple to a vibrational mode, de-excite, or relax down into the primary excited state, and emit a phonon, or the electron may relax into the primary excited state and emit a photon with energy $E_{p12}$, as illustrated in FIG. 1C. In SPEs, typically a transition between excited energy states is not desirable to be radiative, and therefore, any intra-band transition does not typically emit a photon or radiation. Once in the primary excited state, the electron may further relax back into the ground state and emit a photon with energy $E_{p1}$, as illustrated in FIG. 1D.

The emitted photon with energy $E_{p1}$ may have an energy and corresponding wavelength or frequency in the visible range, infrared range, ultraviolet range, or another energy range or band determined by the bandgaps between the ground state and the primary excited state. The excitation energy $E_{p2}$ may be provided by a photon with an energy equal to the band gap between the ground state and the secondary excited energy state, as illustrated in FIG. 1B, or the excitation energy may be an energy that is greater than the band gap between the ground state and the secondary excited energy state. As a person or ordinary skill in the art would recognize, the energy bands in many materials are not flat lines as illustrated in FIGS. 1A-1D, but are curved bands with energy peaks and valleys, and an electron may be excited into any part of a band and migrate along the band before relaxing into a lower energy state. Additionally, while FIGS. 1A-1D depict a system with only three energy states, systems may have any number of energy states with any number of ground or excited energy states. Further, an electron, or the state of an SPE, may be excited to the first excited state having energy $E_1$ directly by excitation radiation having energy equal to or greater than the energy $E_1$, without having to first be excited to the second excitation state or another excited state. In specific examples as described herein, the excitation energy $E_{p2}$ may be provided by a visible, or ultraviolet photon, continuous laser, or pulsed laser source. The emitted photon with energy $E_{p1}$ may be a visible photon or an infrared photon.

Many nanoscale materials and components constrain electrons, or other charge carriers, in one or more spatial dimension. This spatial restriction is known as quantum confinement. The effects of quantum confinement cause charged carriers in a quantum well to occupy only discrete energy levels of the quantum well, as illustrated in FIGS. 1A-1D. The energy bands or energy states are determined by the quantum well material dimensions (i.e., length, width, height, radius, semi-major axis, semi-minor axis, and/or circumference), electromagnetic properties, the specific materials and dopants of the nanoscale material or device, and the number of atomic layers. Additionally, the energy bands and energy subbands determine the radiative wavelengths at which the quantum well is optically active (i.e., optically absorptive, transmissive, and emissive properties of the quantum well). Therefore, depending on the desired wavelengths of optical activity, a scintillator, and specifically a nano-scale SPE, may have a variety of geometries, material compositions, electronic properties, and magnetic properties. Quantum confinement can also occur in two spatial dimensions as is demonstrated in quantum shell structured SPEs.

In embodiments, an SPE, as described herein, may be a 1D, 2D, or 3D material that emits photons when excited by radiation, including few-layer materials, which may also be described herein as multi-layer materials. The multi-layer materials further have impurities or embedded dopants that exhibit properties of quantum confinement causing the dopants to emit single-photons under proper excitation.

Figure 2:
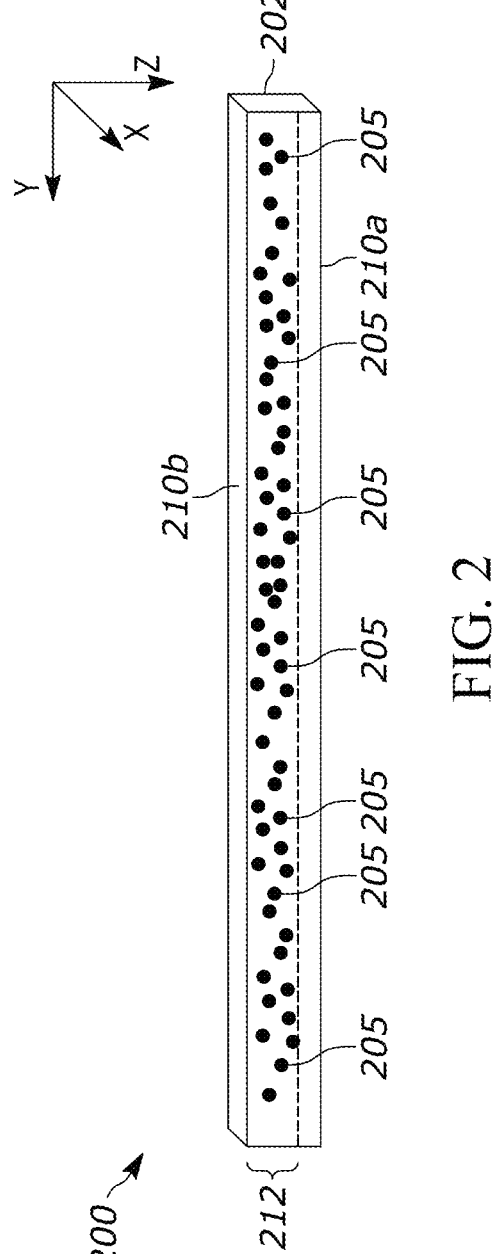
FIG. 2 illustrates an SPE device including a flake of a multi-layer material embedded with dopants.

FIG. 2 illustrates an SPE device 200 including a flake 202 of a multi-layer material embedded with dopants 205. The dopants 205 are SPEs that emit single-photons under excitation. The dopants 205 may include atoms, molecules, gaps, ions, impurities, or other dopants configured to exhibit quantum confinement and emit single-photons. In specific examples, the dopants may include carbon or silicon ions. Defects induced by the dopant implantation such as vacancies, replacement of lattice atoms with the implanted ions, or combinations thereof, may act as SPEs as well. The flake 202 has a first surface 210a and a second surface 210b disposed opposite the first surface 210a, described further herein. The multi-layer material may include one or more of hexagonal boron nitride, a wide-band gap material, pr an insulator material. In examples, the multi-layer material may have a thickness of 3 monolayers or more, 10 monolayers or more, 50 monolayers or more, or 100 monolayers or more. The composition and number of layers of the multi-layer material determines an overall thickness of the flake 202. As described herein, the thickness of the flake is defined as an orthogonal distance between the first and second surfaces 210a and 210b of the flake 202. In examples, the thickness of the flake 202 may be 1.3 nm or more, 100 nm or more, between 1 and 10 nm, 2 and 6 nm, between 4 and 8 nm, between 8 and 12 nm, between 10 and 20 nm, between 1 nm and 100 nm, less than 10 nm, less than 20, less than 50 nm, or less than 100 nm. In specific examples, the flake 202 may include hexagonal boron nitride (hBN) and the dopants 205 may be implanted carbon ions. In other examples, the flake 202, or an SPE substrate, may be a semiconductor material, an insulator material, or another wide-band gap material. As illustrated in FIG. 2, the dopants 205 may be implanted within a range 212 of the second surface 210b. Controlling the distance and distribution of the dopants 205 in the flake 202 allows for engineering and control of the resultant SPE density in the flake 202. The means for controlling the distance of embedded ions is discussed further herein with reference to FIGS. 3A-3C. In examples with a flake thicker than 100 nm and a 50 nm thick carbon mask layer, over 91.7% of the dopants 205 are embedded in the flake 202 within 100 nm of the second surface 210b of the flake 202. The thickness of the flake and the deceleration mask layer determine how much of the dopants 205 embed in the flake for forming SPEs. Controlling of the energies of ions injected into the flake 202 by adapting the deceleration mask provides control of the locations and density of SPEs created. Controlling the energies of the dopants as they embed in the flake minimizes damage to the flake, and materials during the SPE dopant embedding and Spe device fabrication, which is not possible using traditional SPE fabrication systems. This further eliminated the requirement of repair treatments such as post annealing which is common in other SPE fabrication systems and approaches.

Figure 3A:
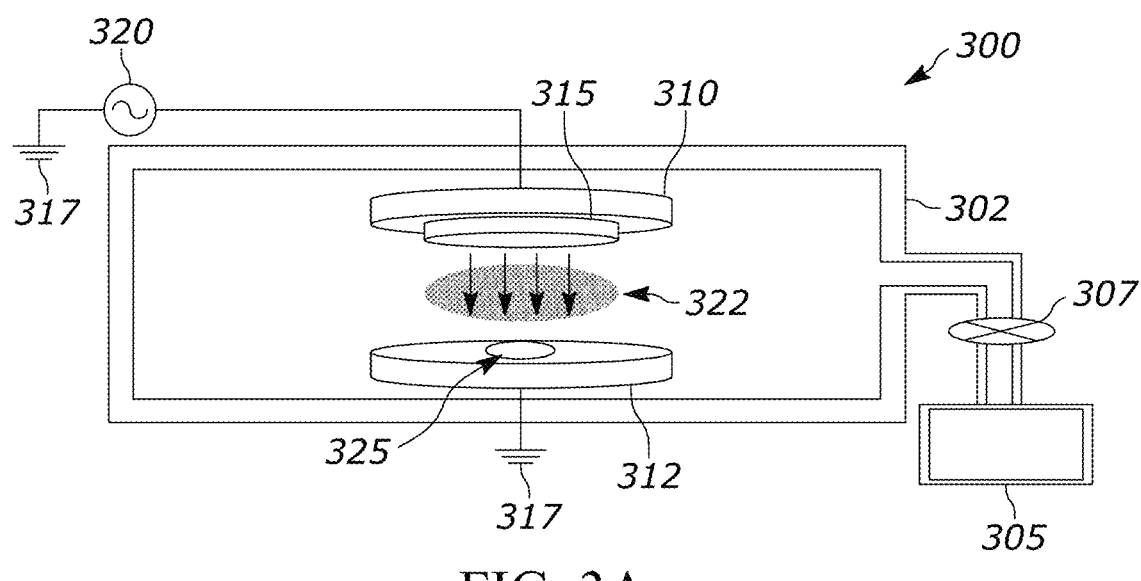
FIG. 3A is a diagram of system for fabricating a deceleration mask.

FIG. 3A is a diagram of a system 300 for fabricating a deceleration mask layer for fabricating SPE devices, such as the SPE device 200 of FIG. 2. The system 300 includes a vacuum chamber 302 having a vacuum pump 305 that provides a vacuum to the vacuum chamber 302 to establish a low-pressure environment inside of the vacuum chamber 302. The vacuum chamber 302 further includes a vacuum valve 307 that controls fluid flow into, and out of, the vacuum chamber 302. A cathode 310 and an anode 312 are disposed inside of the vacuum chamber 302, with the cathode 310 and anode 312 disposed away from each other and across from each other to generate an electric field between the cathode 310 and the anode 312. A radio-frequency (RF) power source 320 is electrically coupled to the cathode 310 to provide a voltage to the cathode 310. An electrical ground 317 is electrically coupled to the anode 312 to generate a voltage difference between the cathode 310 and the anode 312, and to generate a voltage gradient in the region between the cathode 310 and the anode 312. A deceleration material plate 315 is physically disposed adjacent to, and may be physically coupled to, the cathode 310. The deceleration material plate 315 includes materials that form a plasma 322 under the influence of an RF voltage. The materials of the plasma 322 then deposit in a target region 325 of the anode 312 and form a deceleration mask layer. The deceleration material plate 315 may be a carbon plate configured to provide carbon to form the deceleration mask layer for deceleration ions during ion implantation of an SPE device, described further in reference to FIG. 3B.

Figure 3B:
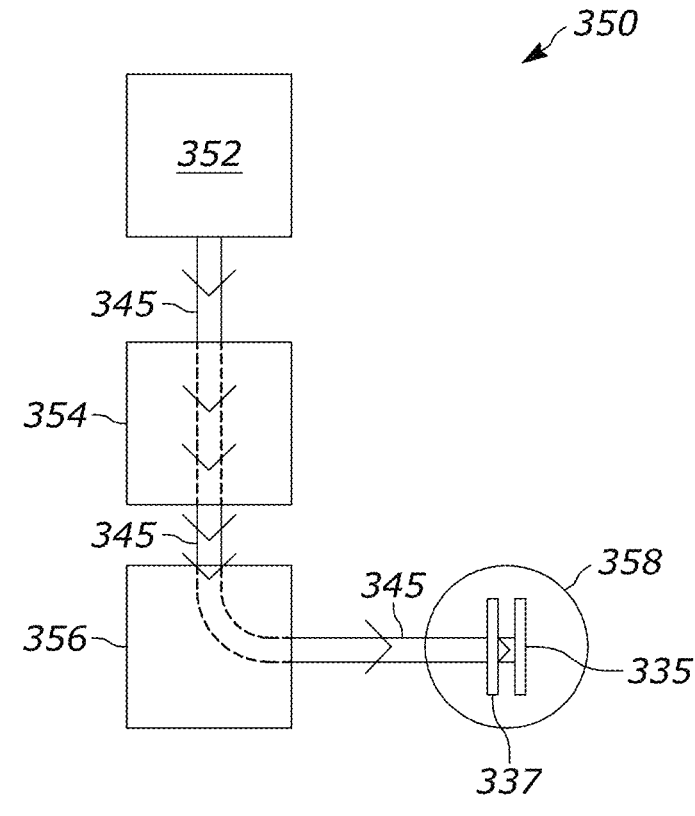
FIG. 3B is a diagram of a system for performing ion implantation using a deceleration mask for fabrication SPE devices.
Figure 3C:
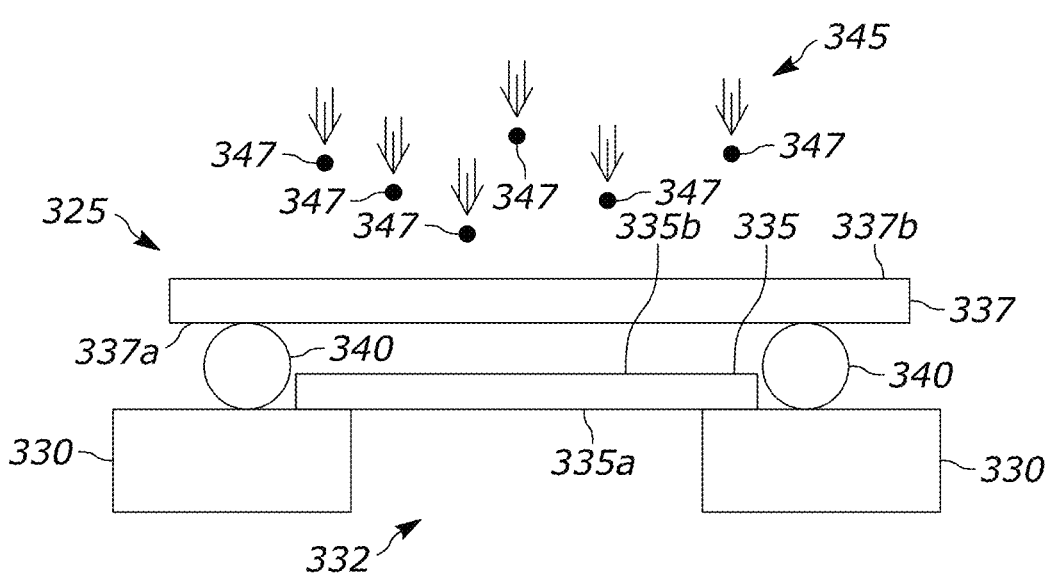
FIG. 3C is a diagram illustrating elements of the target region of FIG. 3A and ion implantation into a substrate using a deceleration mask.
Figure 3D:
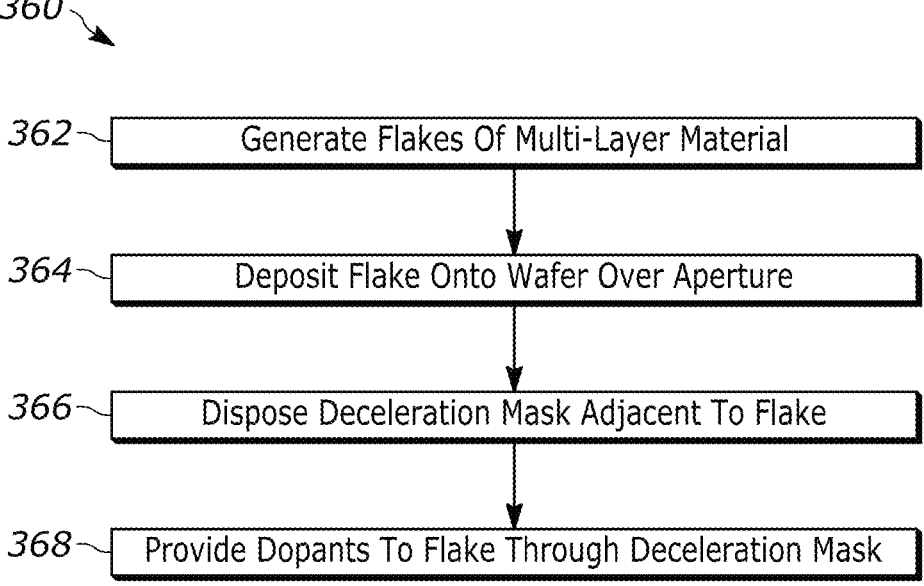
FIG. 3D is a flow diagram of a method for fabricating narrow band determinable SPE devices according to embodiments described herein.

FIG. 3B is a diagram of a system 350 for performing ion implantation for fabricating SPE devices. The system 350 includes an ion source 352 that provides an ion beam 345 to an accelerator 354. The ions of the example illustrated in FIG. 3B are one possible dopants for fabricating SPE devices as disclosed herein. The accelerator 254 then accelerates the ions of the ion beam 345 to increase the energy of the ions, to further collimate the ion beam, and to allow for finer selection of ion energies through filtering via further magnets. A magnet 256 then guides the accelerated ion beam 345 toward a target region 358 that includes a deceleration mask 337 and an SPE substrate 335. The magnet 256 also acts as a filter that filters ions within a certain energy band to pass to the target region 358 which allows for further control of the energies of ions in the ion beam, and control of the distribution and density of implanted ions in an SPE device. FIG. 3C is a diagram illustrating elements of the target region 358 of FIG. 3B for performing ion implantation for fabricating SPE devices, such as the SPE device of FIG. 2. A wafer 330 having at least one aperture 332 is disposed in the target region 358 in a vacuum chamber. The aperture 332 may be circular, rectangular, square, or another shape. The SPE substrate 335 is disposed on the wafer 330, with at least a portion of the SPE substrate 335 disposed over the aperture 332. As illustrated, the SPE substrate 335 may be a flake having a first surface 335 facing the wafer 330, and partially in contact with the wafer 330, and a second surface 335b that is opposite the first surface 335a. The second surface 335b is further from the wafer 330 than the first surface 335a, and the second surface faces away from the wafer 330. In examples, the wafer 300 may be a silicon, silicon nitride, silica, sapphire, metals, or other substrate materials. In examples, the SPE substrate 335 may include one or more multi-layer materials having 1 to 3 layers, 3 to 5 layers, 5 to 10 layers, 10 to 20 layers, less than 10 layers, less than 15 layers, 10 to 20 layers, 10 to 100 layers, 50 to 200 layers, or 100 or more layers. The SPE substrate 335 may be a flake, a 2D material, a nanoplatelet, or another geometry or shape for providing dopants to form SPEs is the material. The SPE substrate 335 may include one or more materials such as hexagonal boron nitride, molybdenum, disulfide, diselenide, ditelluride, tungsten, or a quasi-two-dimensional material.

The deceleration mask layer 337 is disposed adjacent to the SPE substrate 335. The deceleration mask layer 337 is configured to slow down, or decelerate, particles such as ions that may propagate through the deceleration mask layer 337. For example, the deceleration mask layer 337 may be a carbon film, or graphene, that is configured to decelerate carbon ions that propagate through the deceleration mask layer 337. In other examples, the deceleration mask layer may include silicon or a silicon film. As illustrated, the deceleration mask layer 335 may be disposed near, without being in contact with, the SPE substrate 335. In other examples, the deceleration mask layer 337 may be in direct contact with the SPE substrate 335. As such, the term "adjacent" should be understood to be used herein as indicating either an element or object being in direct contact with, or being near without being in direct contact with, another object or surface. The deceleration mask layer 337 has a flake-side surface 337a adjacent to, and facing, the SPE substrate 335, and an exposed surface 337b opposite the flake-side surface 337a, with the exposed surface facing away from the SPE substrate 337b. During fabrication of an SPE device, the exposed surface 337b is exposed to an ion beam 345, and the ions 347 of the ion beam 345 impinge on the deceleration mask layer 337 at the exposed surface 337b. In the illustrated example, a spacer 340 is disposed between the deceleration mask layer 337 and the SPE substrate 330 to position the deceleration mask layer 337 above the SPE substrate 335 between the SPE substrate 335 and the source of the ion beam 315. The spacer 340 may include a network of spacers arranged in a matrix, such as a mesh, to dispose the deceleration mask layer 337 on top of the matrix. In examples, the spacer 340 may be a copper mesh, a plate with an aperture, pedestals, or another spacer to support the deceleration mask layer 337 in a position relative to the SPE substrate 335 for fabricating SPE devices as described herein.

The deceleration mask layer 337 slows the ions 347 of the ion beam 345 before the ions 347 impinge on the SPE substrate 335. The ions 347 then implant into the SPE substrate 335 through the second surface 335b of the SPE substrate 335. Typically, implanting dopants, such as the ions 347, into a substrate via an energetic ion beam can cause fractures, crystallographic defects, excess heat or phonon generation, and/or cause other undesirable structural changes in an SPE substrate. Any such physical structural defects cause the broadening of any photon emission wavelength band, and additionally cause SPEs that emit at different center wavelengths. This results in the fabrication of SPE devices that emit at unpredictable wavelengths, and across broad spectrums. As such, the efficiency of emission of a single-photon within a desired wavelength range is extremely low. Therefore, typical SPE devices with implanted ions are not practical for use in many environments and applications because the emission spectrum is broad, and the emission center wavelengths are not precise, predictable, or readily repeatable in fabrication. Further, typical SPE fabrication setups using ion implantation do not include any aperture in the wafer 330, which results in ions impinging on the wafer 330. The ions that impinge on the wafer 330 can reflect back into the substrate 335 and can further cause heating at the interface of the SPE substrate 335 and the wafer 330. As such, fabrication systems that do not include an aperture 332 in the wafer 330 result in SPE devices having additional physical defects (relative to the SPE devices produced by the method described herein), which further reduces the overall performance of the SPE devices. FIG. 3C is a flow diagram of a method 360 for fabricating narrow band, determinable SPE devices according to embodiments described herein. The method 360 may be implemented using the system 300 of FIGS. 3A and 3B, or by another fabrication system capable of implanting dopant ions into a substrate. For clarity, the method 360 of FIG. 3C will be described with reference to elements of FIGS. 3A and 3B. The method 360 includes generating an SPE substrate 335 of a multi-layer material (block 362). The SPE substrate 335 may be a freestanding multi-layer material, such as a hBN flake. In examples, the SPE substrate 335 may be generated via a tape exfoliation method. The SPE substrate 335 is then transferred to the wafer 330 and disposed on the wafer 330 with at least a portion of the SPE substrate 335 disposed over the aperture 332 (block 364). In disposing the SPE substrate 335 on the wafer 330, the SPE substrate 335 may be transferred using a polydimethylsiloxane (PDMS) film, by pressing the PDMS film onto the SPE substrate 335, and stamping the SPE substrate 335 onto the wafer 335 partially over the aperture 332 using a dry transfer method. Prior to disposing the SPE substrate 335 on the wafer 330, the wafer 330 may be sanitized or cleaned to remove contamination from surfaces of the wafer 330. Cleaning the wafer 330 may include rinsing the wafer 330 in acetone and/or methanol, and/or cleaning the wafer 330 by ozone plasma cleaning.

The method 360 further includes disposing the deceleration layer 337 adjacent to the SPE substrate 335 (block 366). As further described herein, the deceleration layer 337 slows down (i.e., reduces the kinetic energy) of ions passing through the deceleration mask layer 337 before the ions impinge on, and implant into, the SPE substrate 335. The thickness, density, and material composition of the deceleration layer 337 determine the amount of the deceleration of particles, and specifically ions, propagating through the deceleration mask layer 337. In examples, the deceleration mask layer may have a thickness 1.3 nm or more, 10 nm or more, 25 nm or more, 50 nm or more, 100 nm or more, less than 50 nm, or less than 100 nm or of another thickness as desired or required for fabricating SPE devices.

The ion beam 345 is directed at the exposed surface 337*b* of the deceleration mask layer 337 (block 368). As previously described, the ion beam is provided by an ion source 352, accelerated using an accelerator 354, and directed toward the deceleration mask layer 337 using a magnet 356. The ion beam 345 impinges on the exposed surface 347*b* of the deceleration mask layer 337 and the deceleration mask layer 337 decelerates the ions 347 of the ion beam 345. The ions 347 of the ion beam 345 propagate through the deceleration mask layer 337 and are provided to the SPE substrate 335 until at least a portion of the ions 347 are implanted into the SPE substrate 335. The kinetic energy of each individual ion 347 determines how far each respective ion 347 propagates into, and further implants into, the SPE substrate 335. The method 460 may further include monitoring the temperature of the SPE substrate 335 during the fabrication of the SPE device to ensure that the temperature of the SPE substrate 335 does not exceed a limit.

SPE devices were fabricated using the method 360 of FIG. 3C and systems according to the diagrams of FIGS. 3A and 3B. The resultant SPE devices were observed to generate deterministic photons with narrow wavelength bands at room temperature with high-luminosity and long output-emission stability. The following description provides one specific example of fabricating SPE devices using the disclosed systems and methods. The specific materials and geometries described illustrate one embodiment, other embodiments are envisioned. The SPE substrate 335 used for fabricating the SPE devices was a multi-layer hBN flake with typical dimensions (i.e., length and width along the x- and y-axes of FIG. 2) each larger than 20 μm. A silicon wafer with a 10 μm center aperture was used as the wafer 330. A copper mesh grid was deposited on the wafer 330 using a transmitting electron microscope (TEM) with a 1×1 mm$^2$ aperture. A 60 nm to 100 nm thick carbon film was deposited on the copper grid using carbon rod coating to form the deceleration mask layer 337. The thickness of the deceleration mask layer 337 was determined depending on the desired amount of doping ions to implant into the SPE substrate 335. Thicker deceleration mask layers 337 provided less doping and reduced depth of the dopant ions into the SPE substrate 335, whereas thinner deceleration mask layers 337 allowed for increased amounts of doping and deeper implantation of dopants into the SPE substrate 335.

A carbon ion beam was provided to the SPE substrate 335 through the deceleration mask layer 337. The ions 347 of the carbon ion beam had energies of 40 keV and a flux of $6.9 \times \times 10^{10}$ ions/(cm$^2$s) resulting in a total fluence of $2.5 \times 10^{14}$ ions/cm$^2$. The SPE substrate 335 was held at room temperature during irradiation under the ion beam 322. The ion beam 322 had a circular cross sectional shape with a diameter of 3 mm. The deceleration mask layer 337 slowed the carbon ions down to enable implantation of the carbon ions in the hBN flakes within 100 nm below the second surface 335*b* of the SPE substrate 335.

Figure 4:
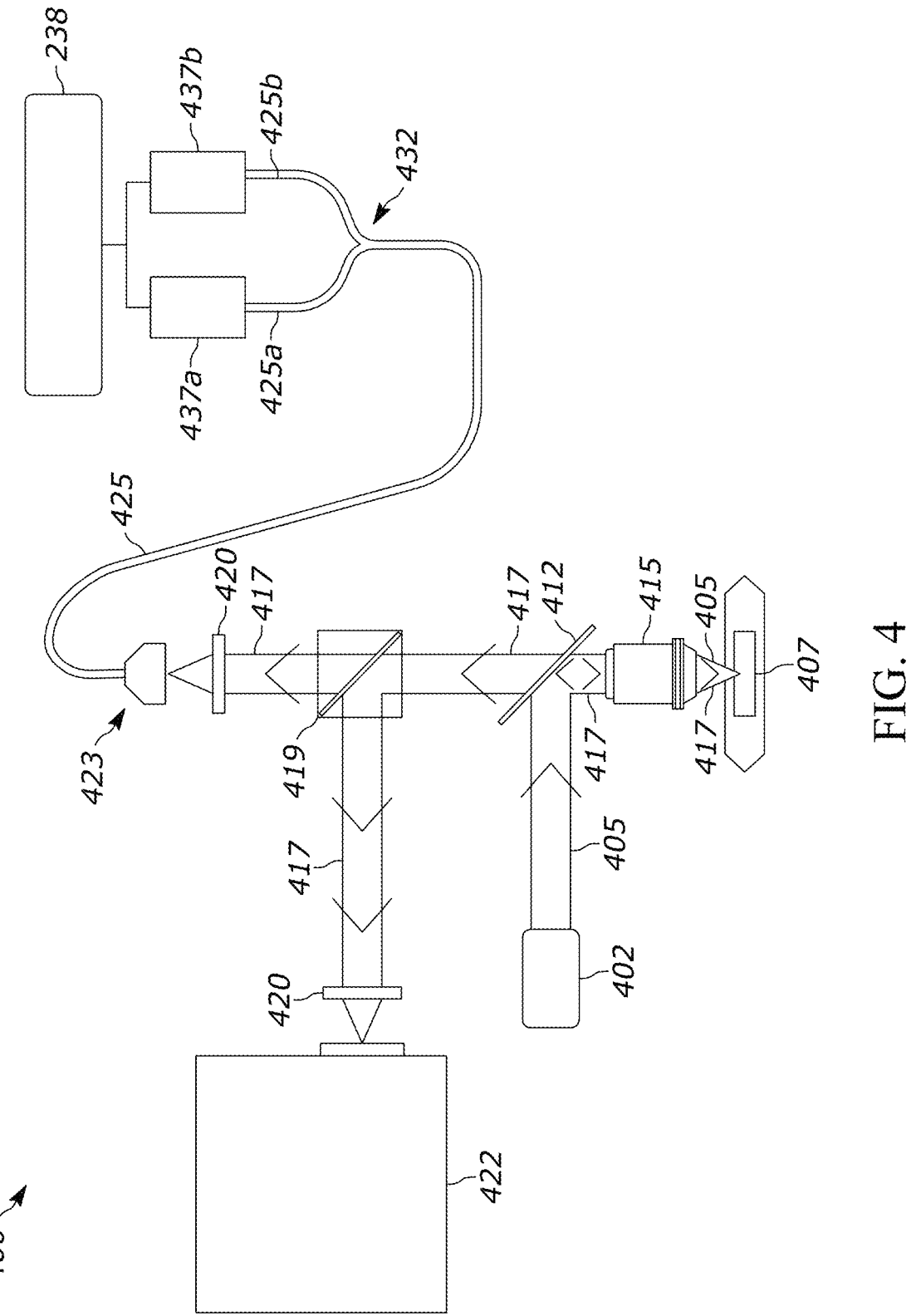
FIG. 4 is a diagram of an example system for generating single-photons using an SPE device fabricated according to the methods and systems disclosed herein.

Various properties and characteristics and properties of the fabricated SPE devices, and resultant photonic emissions, were investigated. FIG. 4 is a diagram of an example system 400 for generating single-photons using an SPE device fabricated according to the methods and systems disclosed herein. The system 400 of FIG. 4 may be used to generate and collect single-photons emitted from an SPE device. The system 400 includes an excitation radiation source 402 configured to provide excitation radiation 405 to an SPE device 407. The excitation radiation source 402 provides the excitation radiation 405 to a dichroic mirror 412 that reflects the excitation radiation 405 into a microscope objective 415 which further focuses the excitation radiation 405 onto the SPE device 407. The excitation radiation 405 excites the SPEs of the SPE device 407, and the SPEs emit single photons 417. The microscope objective 415 collects the emitted single photons 417, and the dichroic mirror 412 transmits the emitted single photons 417. A beam splitter 419 splits the emitted single photos into two paths directed toward collection optics 420 for performing time correlated single photon counting, or toward a spectrometer 422 for performing photoluminescence spectroscopy measurements. In examples, the collection optics 420 may include one or more lenses, collimators, filters, gratings, etc. for collecting the single photons 420 and providing them to optical fibers, detectors, or other elements for further manipulation and detection. In examples, the collection optics 420 may provide the emitted single photons 417 to a spectroscope, a detector (e.g., an avalanche photodiode, a photodiode, a single-photon detector), or to another detector, device, or system.

The system 400 illustrated in FIG. 4 provides a schematic for performing both photoluminescence spectroscopy using a first path of the single photons, and time correlated single photon counting (TCSPC) using a second path, as provided by the beam splitter 419. In the first path, collection optics 420, focus the emitted single photons into a spectrometer 422 for performing photoluminescence spectroscopy. In the second path, the collection optics 420 further include a fiber coupler 423 that couples the emitted single-photons 417 into an optical fiber 425. A 50/50 fiber beam splitter 432 then splits the emitted single photons 417 into two paths 425*a* and 425*b*. Each path 425*a* and 425*b* provided the single photons to a respective avalanche photodiode (APD) 437*a* and 427*b* that detected the single photons. The APDs 437*a* and 437*b* then generated signals indicative of the detected photons and provided the generated signals to a TCSPC device 238 for performing cross-correlation measurements.

The photoluminescence of the fabricated SPE devices was measured using a confocal Raman microscope (Renishaw inVia Qontor) with a typical spatial resolution of 0.3 μm. The confocal Raman microscope was used to measure the locations and photoluminescent spectra of the single-photon emitters (i.e., implanted carbon ions). The photoluminescence measurement may be performed using a system similar to the system 400 of FIG. 4, with the collection optics 420 providing the emitted single-photons 417 to the Raman microscope. The photoluminescence of the SPE devices was measured using the Raman microscope in a map scanning mode with a step size of 0.5 μm. the map scanning mode provides luminescence measurements across a 2D plane which can be used to determine the locations of the single-photon emitters in the SPE devices. A solid state laser with emission wavelength of 532 nm was used as the excitation source, and a 600 line/mm grating was used in the Raman microscope to extract the spectra of the emitted photons.

Figure 5A:
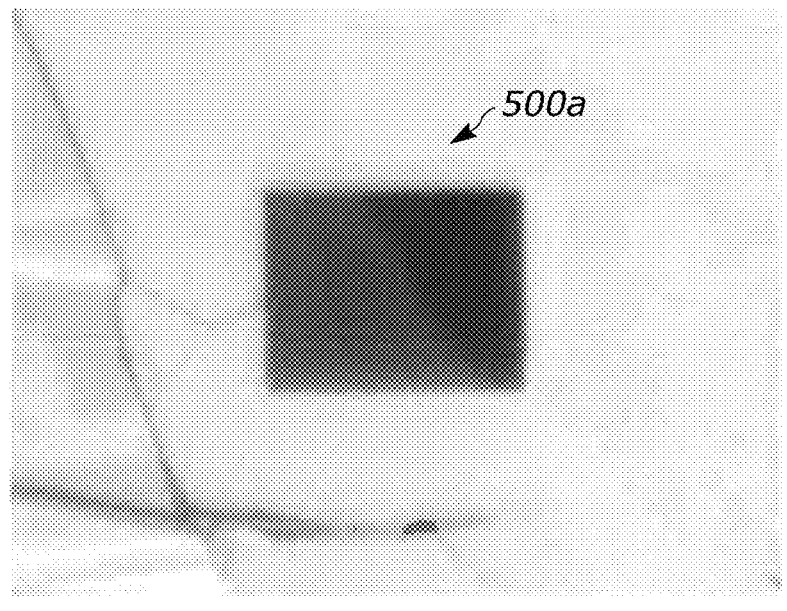
FIG. 5A is a sample image of an SPE device fabricated according to the disclosed systems and methods.
Figure 5B:
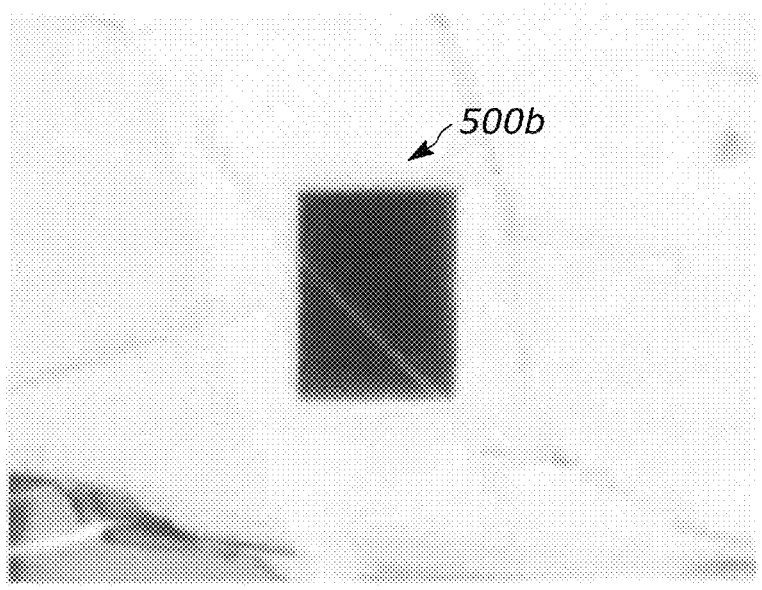
FIG. 5B is a sample image of another SPE device fabricated according to the disclosed systems and methods.
Figure 5C:
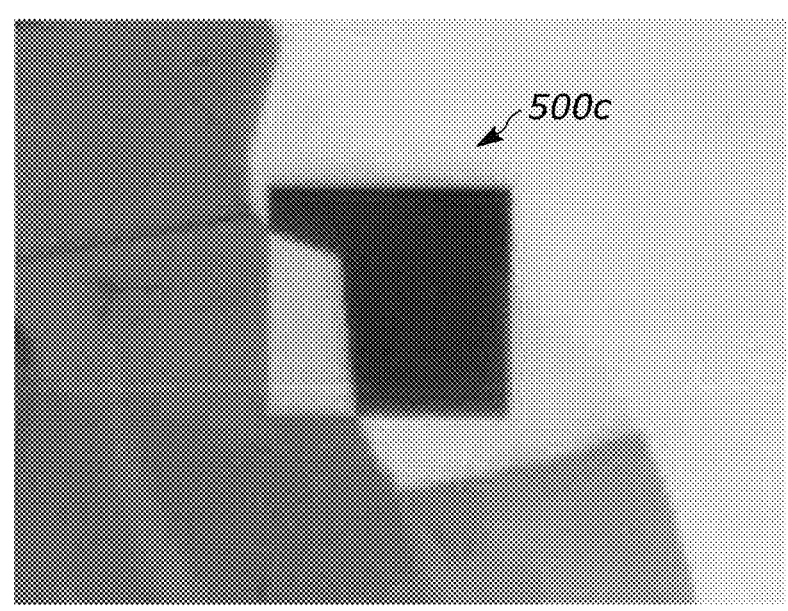
FIG. 5C is a sample image of yet another SPE device fabricated according to the disclosed systems and methods.
Figure 6A:
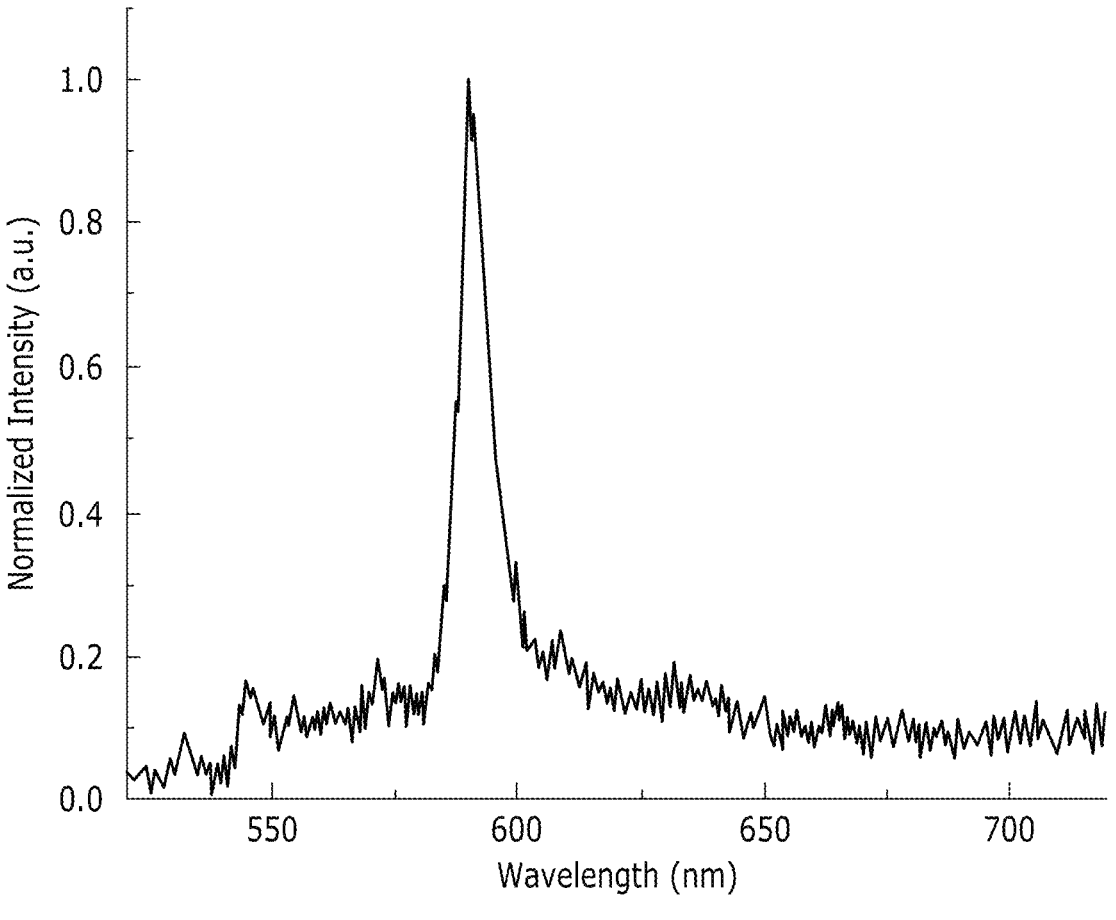
FIG. 6A is a plot of single-photon emission spectra around 590 nm for a sample SPE device.
Figure 6B:
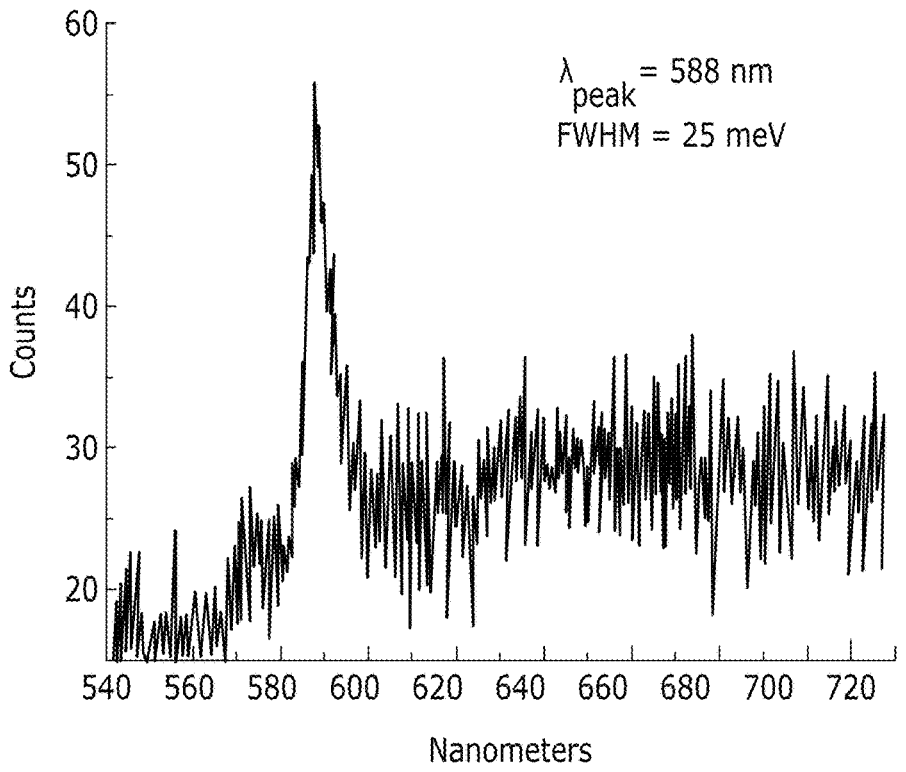
FIG. 6B is a plot of single-photon emission spectra around 588 nm for a sample SPE device.
Figure 6C:
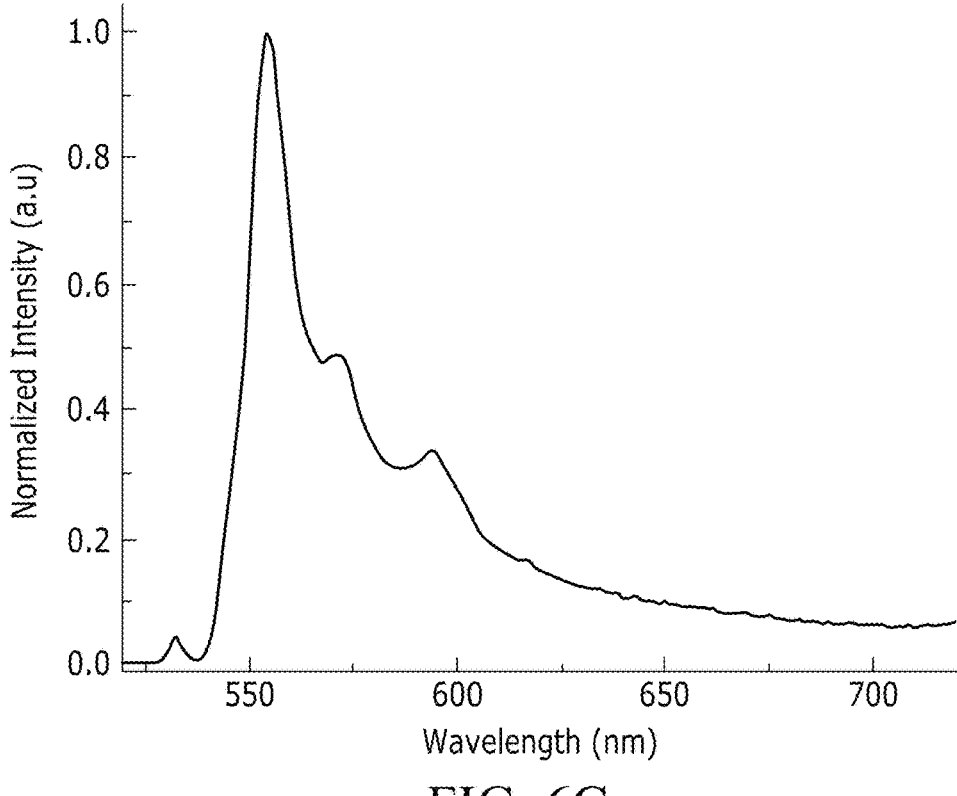
FIG. 6C is a plot of single-photon emission spectra around 55 nm for a sample SPE device.
Figure 7A:
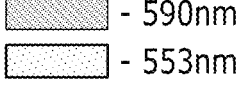
FIG. 7A is a 3D barplot of locations and photoluminescent intensities of 590 nm emitting SPEs, and 555 nm emitting SPEs in a portion of a sample SPE device.
Figure 7A:
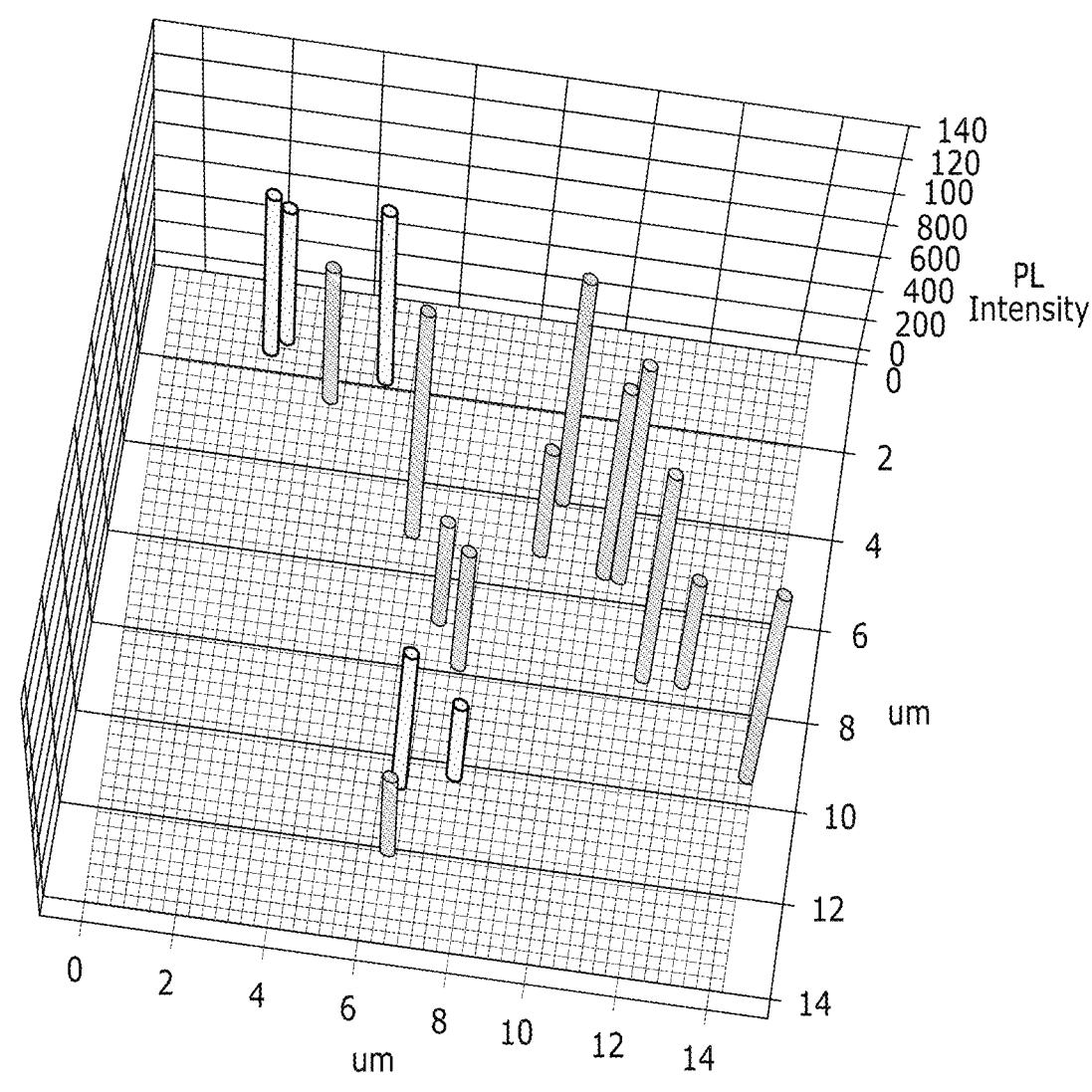
Figure 7B:
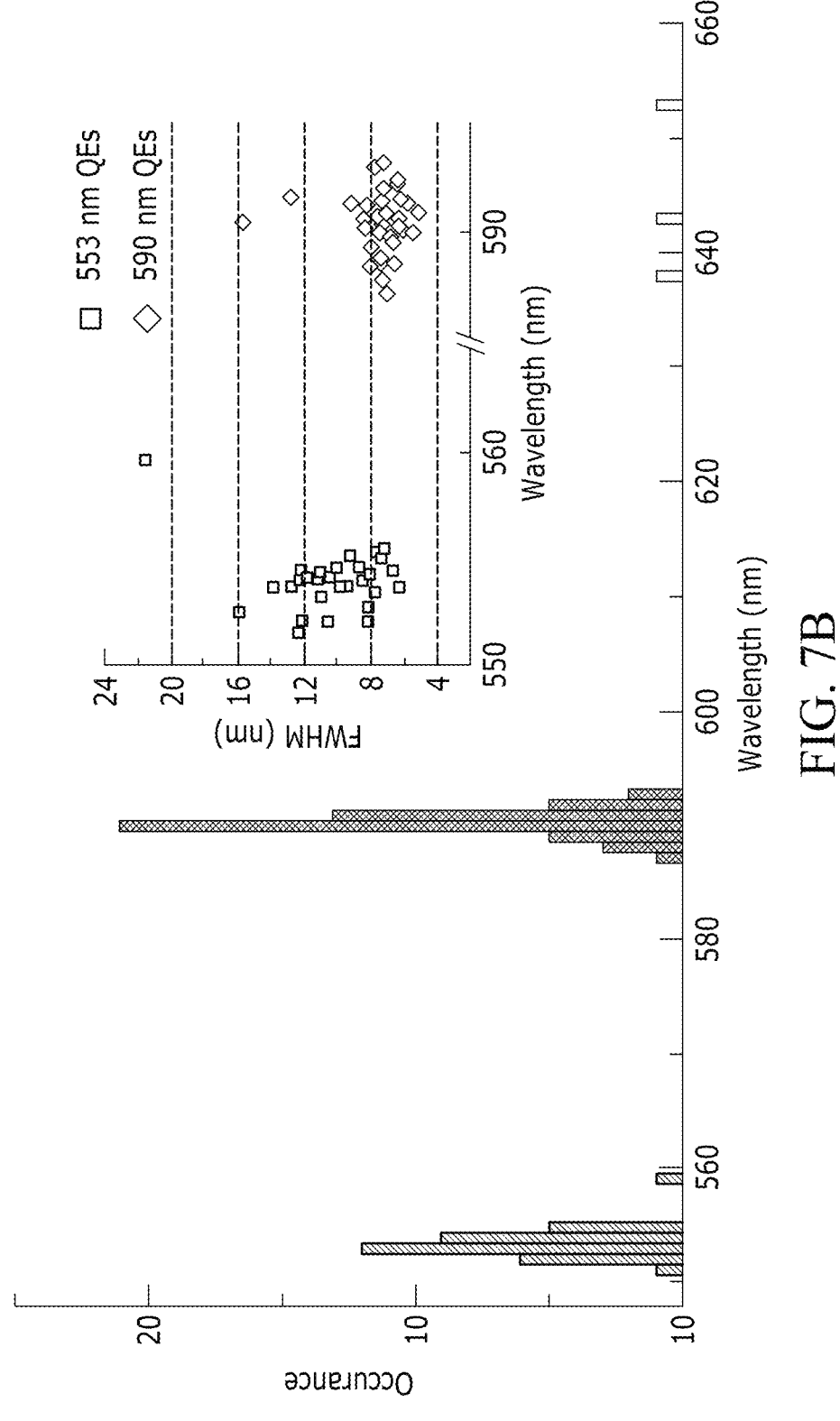
FIG. 7B is a barplot of population density versus emission wavelength for the SPE device reported in FIG. 7A.

FIGS. 5A-5C are images of sample SPE devices 500*a*-500*c*, respectively, and FIGS. 6A-6C are plots of single-photon emission spectra of SPEs for sample SPE devices, as measured by the Raman microscope. The SPEs were found to emit photons with peak wavelengths and standard deviations of 590.7±2.5 nm and 553.5±2.7 nm, referred to herein as 590 nm and 553 nm emitters or SPEs and as shown in the plots of FIGS. 6A and 6C respectively. The peak wavelength is defined as the wavelength at which photons emitted by a SPE are most likely to occur. In examples, over 95% of the 590 nm SPEs created by the method emit photons within the range from 585.7 nm to 595.7 nm at room temperature. SPEs may emit photons with peak wavelength distributions or standard deviations of less than 5 nm, less than 2.5 nm, or less than 1 nm at room temperature. The single photons emitted by a 590 nm SPE had a full-width at half-max (FWHM) bandwidth of 21 meV, and the photons centered at 553 nm had a FWHM bandwidth of 43 meV. In examples, the SPEs may have emission bandwidths of less than 50 nm, less than 25 nm, less than 16 nm, or less than 10 nm at room temperature. The photon emissions at 590 nm and 553 nm were further spatially mapped to determine the locations of the SPEs emitting photons at the corresponding 590 nm and 553 nm wavelengths. FIG. 7A is a 3D barplot of the locations and photoluminescent intensities of the 590 nm and 553 nm emitting SPEs in a portion of a sample SPE device fabricated according to the disclosed systems and methods. The photoluminescence is reported in relative intensities as indicated by the relative heights of the bars with the maximum observed emission rate being 0.43 MHz for the 553 nm emitters, and 0.92 MHz for the 590 nm emitters. The measurements did not take into account all losses of the system, and also the system is expected to have additional losses due to misalignment. Therefore, in examples, the SPEs may have brightnesses with emission intensities greater than 0.5 MHz, and/or greater than 1 MHz for 553 nm and 590 nm SPEs. The photoluminescent spectrum of the SPE device of FIG. 7A was aggregated to determine the population density and emission spectrum of the SPE device. FIG. 7B is a barplot of the population density versus emission wavelength for the device reported in FIG. 7A. The data of FIG. 7B shows that the FWHM bandwidths of most 553 nm and 590 nm emitters was narrower than 12 nm with typical FWHM bandwidths of 10.5 nm, and 6.8 nm respectively. The inlaid plot further shows and suggests that the FWHM bandwidth of the 590 nm emitting SPEs can be narrower than 5 nm.

A TCSPC measurement was performed using the system 400 of FIG. 4. The radiative lifetime of the SPEs was determined from the TCSPC to measure the maximum photon emission efficiency for the fabricated SPE devices. Additionally, the anti-bunching behavior of the SPE devices was measured to evaluate the performance of the SPE devices as single-photon sources. For the TCSPC measurements, a 100× magnification objective with a 0.90 numerical aperture was used as the microscope objective 415 to focus the excitation radiation 405 into the SPE device, and further to collect the emitted single-photons 417 from the SPE device. A multimode fiber was used as the optical fiber 425 to reduce optical coupling losses. As shown, the emitted single-photons 417 were then guided into a Hanbury Brown and Twiss (HBT) interferometer using the beam splitter 432 and APDs 437. The emitted single-photons 417 were equally divided into two paths and provided to the two APDs 437. A 532 nm CW laser was used as the excitation radiation source 402. The temporal information of the photon emission events were recorded using the APDs 437 a TCSPC unit (PicoQuant MultiHarp 150). Cross-correlation of photon emission events were calculated and the temporal properties of the SPE devices was determined.

Figure 8A:
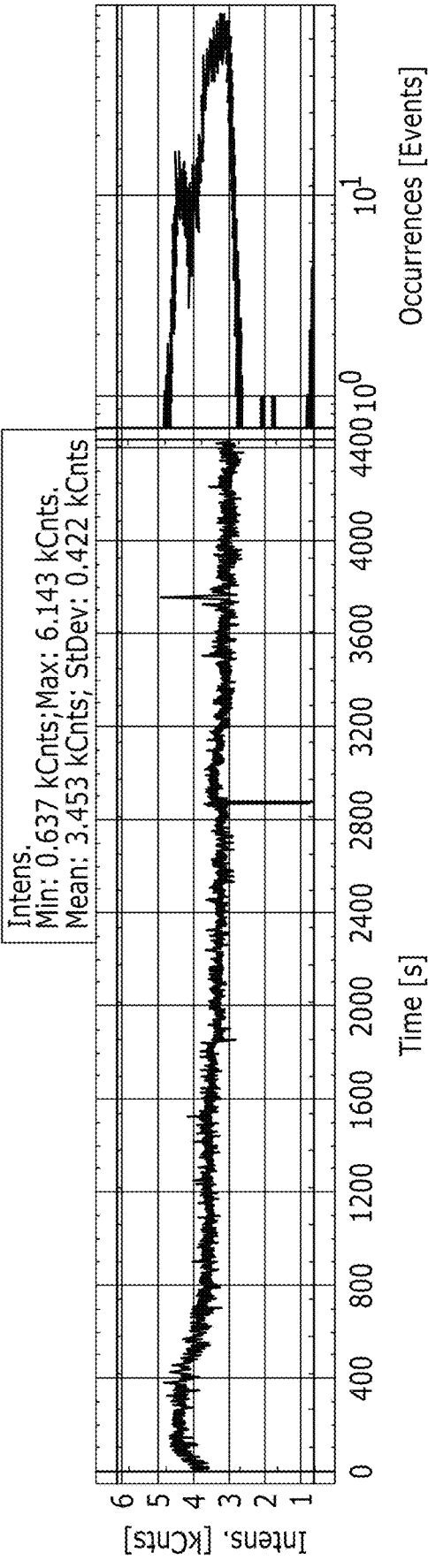
FIG. 8A is a plot of the photoluminescent intensity of an SPE device over time.
Figure 8B:
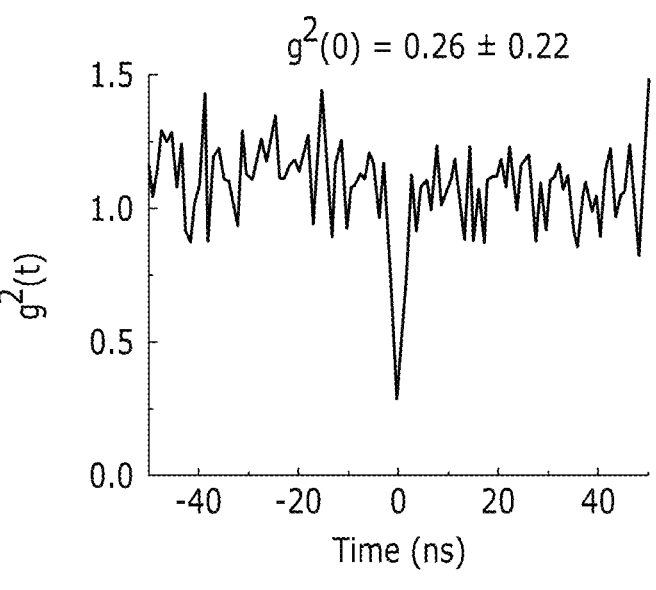
FIG. 8B is a plot of antibunching data reported as the second correlation function, $g^2$, with respect to time for the 553 nm emitters.
Figure 8C:
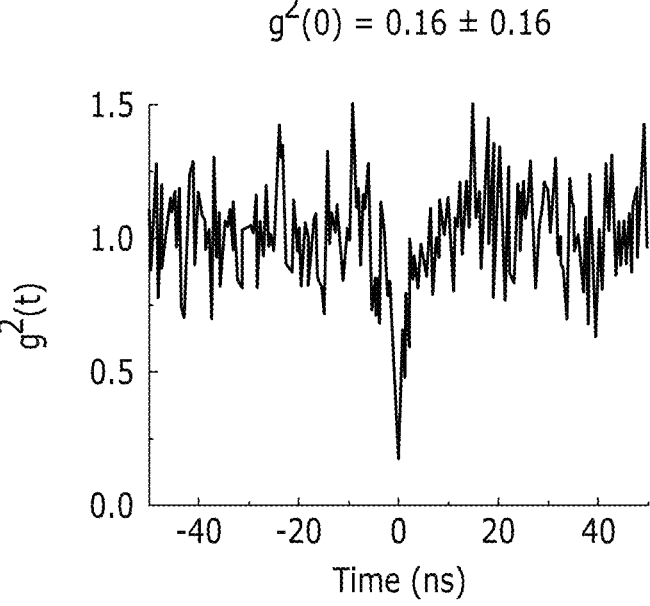
FIG. 8C is a plot of antibunching data reported as the second correlation function, $g^2$, with respect to time for the 590 nm emitters.

FIG. 8A is a plot of the photoluminescent intensity of an SPE device over time. The photoluminescent intensity shows a peak in the first four minutes of operation, with a slow, fairly linear, decay over time. The SPEs performed with long-term stability for over 4400 seconds. The intensity drift over time was mainly due to instabilities and spatial drift of the collection optics and detectors over the time of data collection. The notable decrease in intensity around 2850 seconds was due to a measurement interruption to perform a mid measurement of the SPE devices emission spectrum. The lifetime of the emitters was obtained by fitting the cross-correlation data, where 1.06±0.48 ns and 0.69±0.17 ns were observed for 553 nm and 590 nm SPEs respectively. FIGS. 8B and 8C are plots of antibunching data reported as the second correlation function, $g^2(t)$, with respect to time for the 553 nm and 590 nm emitters respectively. The anti-bunching values were observed to be 0.26±0.22 and 0.16±0.16 for the 553 nm and 590 nm SPEs respectively confirming the single photon emission behavior with high single photon purity. No notable bunching was found at time t=0 suggesting the absence of non-radiative shelving states in the electronic states of the SPEs.

Each of the measurements and data provided above was taken with the SPE device operating in room temperature environments. The ability to generate multiple SPEs with near equal emission wavelengths of 590 nm or 553 nm, and with narrower overall bandwidths around these center wavelengths, is a major improvement of over other SPE devices. Typical SPE devices and fabrication techniques result in photon emission at random wavelengths resulting in indeterminable single-photon energies, and SPEs with short emission stability lifetimes. Controlling the ion dosage and speed (i.e., energy) during implantation, as described herein, reduces damage and defects caused in an SPE substrate (e.g. hBN flake) resulting in high emission yield SPEs with common center wavelength emissions and narrow bandwidths.

Figure 9A:
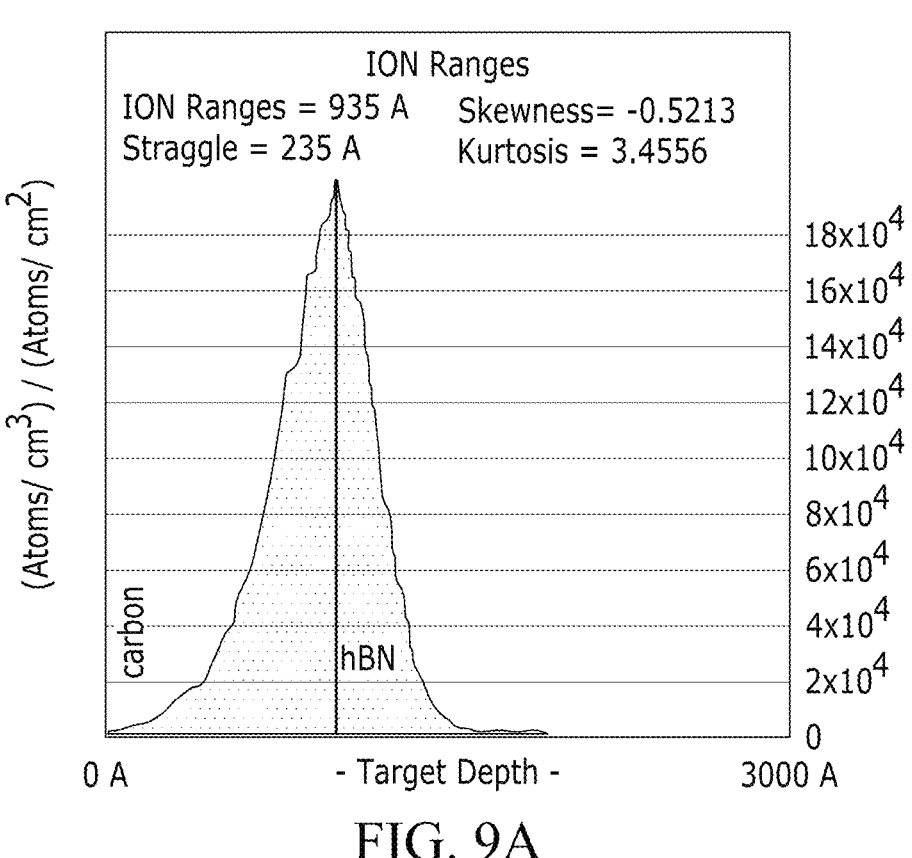
FIG. 9A is a plot of simulated ion implantation density versus depth for a 100 nm thick carbon deceleration mask.
Figure 9B:
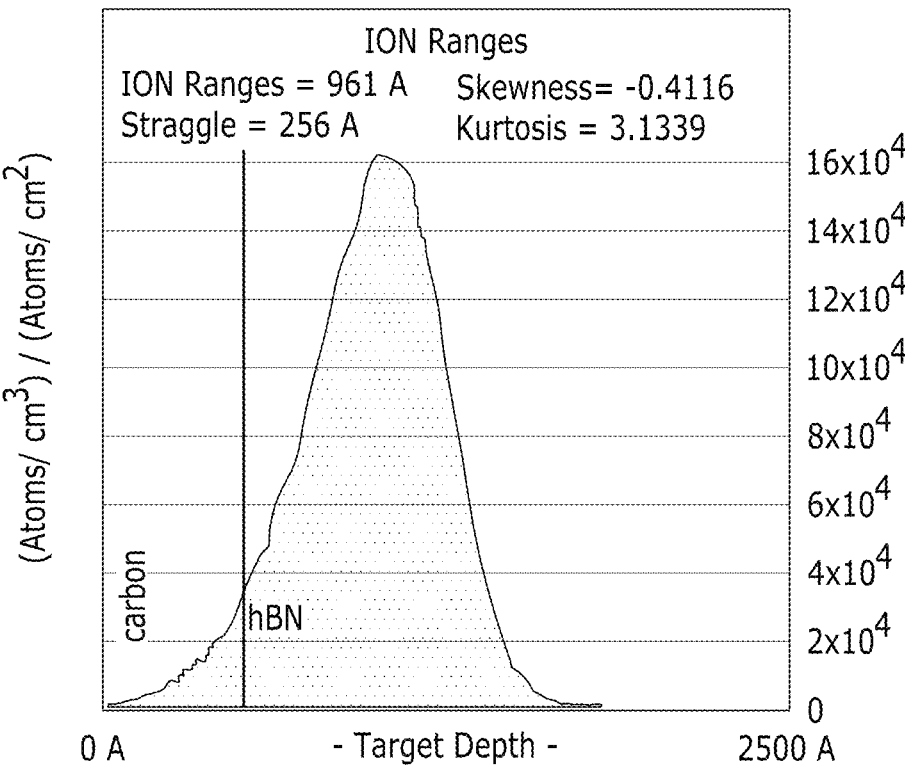
FIG. 9B is a plot of simulated ion implantation density versus depth for a 50 nm thick carbon deceleration mask.

FIGS. 9A and 9B are plots of simulated ion density implantation versus depth into a deceleration mask or SPE substrate, as described herein for fabricating SPE devices. In the examples of FIGS. 9A and 9B, the deceleration masks are carbon mask layers with thicknesses of 100 nm and 50 nm respectively, and the SPE substrate is a hBN flake. The data of FIGS. 9A and 9B shows that over half of the ions implant in the 100 nm thick carbon deceleration mask, while a much smaller portion of the ions implant in the 50 nm carbon deceleration mask. Additionally, with the 50 nm carbon deceleration mask, a much higher percentage of the carbon ions implant in the target depth of the SPE substrate, which for the simulations was 200 nm thick.

The following list of aspects reflects a variety of the embodiments explicitly contemplated by the present disclosure. Those of ordinary skill in the art will readily appreciate that the aspects below are neither limiting of the embodiments disclosed herein, nor exhaustive of all of the embodiments conceivable from the disclosure above, but are instead meant to be exemplary in nature.

1. A method for fabricating optical emitters, the method comprising: disposing, onto a wafer, a flake of a multi-layer material, the wafer having an aperture over which a portion of the flake is disposed, the flake having a first surface partially in contact with the wafer, and a second surface, opposite the first surface; disposing a deceleration mask layer adjacent the flake, the deceleration mask layer having a flake-side surface adjacent to the flake and an exposed surface opposite the flake-side surface; directing an ion beam at the exposed surface of the deceleration mask layer to decelerate ions of the ion beam until at least a portion of the ions are implanted in the flake.

2. The method of aspect 1, wherein the multi-layer material comprises a material having between 3 and 300 layers.

3. The method of either of aspect 1 or aspect 2, wherein the multi-layer material flake comprises hexagonal boron nitride, a semiconductor material, an insulator materials, or a wide-band gap material.

4. The method of any of aspects 1 to 3, wherein the ions comprise carbon ions or silicon ions.

5. The method of any of aspects 1 to 4, wherein the deceleration mask layer comprises a carbon film or silicon film.

6. The method of any of aspects 1 to 5, wherein the multi-layer material flake has a thickness between the first surface and second surface of 100 nm or less.

7. The method of any of aspects 1 to 6, wherein the deceleration mask layer has a thickness between the flake-side and exposed surfaces of 50 nm, 100 nm, or less than 100 nm.

8. The method of any of aspects 1 to 7, further comprising monitoring a temperature of the multi-layer material flake.

9. The method of any of aspects 1 to 8, wherein disposing the deceleration mask adjacent to the flake comprises disposing the deceleration mask on a copper spacer, the deceleration mask disposed at a distance away from the second surface of the flake.

10. A system for generating single-photons, the system comprising: a single-photon emission device fabricated according to the method of any of aspects 1 to 9; an excitation radiation source configured to provide excitation radiation to the single-photon emission device; lensing optics configured to focus the excitation radiation into the single-photon emission device; and collection optics configured to receive single-photons emitted from the single-photon emission device.

11. The system of aspect 10, wherein the single-photon emission device comprises hexagonal boron nitride implanted with carbon ions.

12. The system of aspect 11, further comprising a dichroic mirror configured to (i) reflect the excitation radiation into the lensing optics, and (ii) transmit the single-photons emitted from the single-photon emission device.

13. A single-photon emission device fabricated according to the method of any of aspects 1 to 9, the device comprising: a multi-layer material flake having (i) a first surface, (ii) a second surface opposite the first surface, (iii) a thickness defined by the orthogonal distance between the first and second surfaces, and (iv) implanted ions within 100 nm of the second surface.

14. The device of any of aspect 13, wherein the multi-layer material flake comprises hexagonal boron nitride.

15. The device of either of aspect 13 or aspect 14, wherein the implanted ions comprise carbon ions.

16. The device of any of aspects 13 to 15, wherein the photon emission device emits photons having a wavelength distribution of less than 5 nm, 2.25 nm, or 1 nm.

17. The device of any of aspects 13 to 16, wherein the photon emission device emits photons having an emission linewidth of less than 50 nm, 25 nm, or 10 nm at room temperature.

18. The device of any of aspects 13 to 17, wherein the photon emission device has a emission intensity of greater than 1 MHz.

19. The device of any of aspects 13 to 18, wherein the thickness of the multi-layer material flake is 50 nm, 100 nm, or less than 100 nm.

What is claimed is:

1. A method for fabricating optical emitters, the method comprising:

disposing, onto a wafer, a flake of a multi-layer material, the wafer having an aperture over which a portion of the flake is disposed, the flake having a first surface partially in contact with the wafer, and a second surface, opposite the first surface;

disposing a deceleration mask layer adjacent the flake, the deceleration mask layer having a flake-side surface adjacent to the flake and an exposed surface opposite the flake-side surface; and directing an ion beam at the exposed surface of the deceleration mask layer to decelerate ions of the ion beam until at least a portion of the ions are implanted in the flake.

2. The method of claim 1, wherein the multi-layer material comprises a material having between 3 and 300 layers.

3. The method of claim 1, wherein the multi-layer material comprises hexagonal boron nitride.

4. The method of claim 1, wherein the ions comprise carbon ions.

5. The method of claim 1, wherein the deceleration mask layer comprises a carbon film.

6. The method of claim 1, wherein the flake has a thickness between the first surface and second surface of 100 nm or less.

7. The method of claim 1, wherein the deceleration mask layer has a thickness between the flake-side and exposed surfaces of 50 nm, 100 nm, or less than 100 nm.

8. The method of claim 1, further comprising monitoring a temperature of the multi-layer material flake.

9. The method of claim 1, wherein disposing the deceleration mask adjacent to the flake comprises disposing the deceleration mask on a copper spacer, the deceleration mask disposed at a distance away from the second surface of the flake.

10. A single-photon emission device fabricated according to the method of claim 1, the device comprising:

a multi-layer material flake having (i) a first surface, (ii) a second surface opposite the first surface, (iii) a thickness defined by the orthogonal distance between the first and second surfaces, and (iv) implanted ions within 100 nm of the second surface.

11. The device of claim 10, wherein the multi-layer material comprises hexagonal boron nitride.

12. The device of claim 10, wherein the implanted ions comprise carbon ions.

13. The device of claim 10, wherein the peak wavelength of the emitters in a typical single-photon emission device have a standard deviation of 2.7 nm or less at room temperature.

14. The device of claim 10, wherein the photon emission device emits photons having an emission bandwidths of less than 16 nm at room temperature.

15. The device of claim 10, wherein the photon emission device has a maximum emission intensity of greater than 1 MHz.

16. The device of claim 10, wherein the thickness of the multi-layer material flake is between 1 and 10 nm, or less than 100 nm.

17. A system for generating single-photons, the system comprising:

a single-photon emission device fabricated according to the method of claim 1;

an excitation radiation source configured to provide excitation radiation to the single-photon emission device;

lensing optics configured to focus the excitation radiation into the single-photon emission device; and collection optics configured to receive single-photons emitted from the single-photon emission device.

18. The system of claim 17, wherein the single-photon emission device comprises hexagonal boron nitride implanted with carbon ions.

19. The system of claim 17, further comprising a dichroic mirror configured to (i) reflect the excitation radiation into the lensing optics, and (ii) transmit the single-photons emitted from the single-photon emission device.

* * * * *